United States Patent
Zhu et al.

(10) Patent No.: US 7,163,896 B1
(45) Date of Patent: Jan. 16, 2007

(54) BIASED H₂ ETCH PROCESS IN DEPOSITION-ETCH-DEPOSITION GAP FILL

(75) Inventors: Wenxian Zhu, Palo Alto, CA (US); Jengyi Yu, San Jose, CA (US); Siswanto Sutanto, San Jose, CA (US); Pingsheng Sun, San Jose, CA (US); Jeffrey Chih-Hou Lowe, Milpitas, CA (US); Waikit Fung, Cupertino, CA (US); Tze Wing Poon, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 66 days.

(21) Appl. No.: 10/733,858

(22) Filed: Dec. 10, 2003

(51) Int. Cl.
*H01L 21/311* (2006.01)
(52) U.S. Cl. .............................. 438/694; 257/E21.218
(58) Field of Classification Search ................ 438/694, 438/695, 700, 702; 257/E21.218; 436/694, 436/695, 700, 702
See application file for complete search history.

(56) References Cited

U.S. PATENT DOCUMENTS

| | | | |
|---|---|---|---|
| 4,361,461 A | 11/1982 | Chang | |
| 5,129,958 A | 7/1992 | Nagashima et al. | |
| 5,227,191 A | 7/1993 | Nagashima | |
| 5,246,885 A | 9/1993 | Braren et al. | |
| 5,252,178 A | 10/1993 | Moslehi | |
| 5,270,264 A | 12/1993 | Andideh et al. | |
| 5,282,925 A | 2/1994 | Jeng et al. | |
| 5,342,801 A | 8/1994 | Perry et al. | |
| 5,385,857 A | 1/1995 | Solo de Zaldlvar | |
| 5,494,854 A | 2/1996 | Jain | |
| 5,516,729 A | 5/1996 | Dawson et al. | |
| 5,532,516 A | 7/1996 | Pasch et al. | |
| 5,621,241 A | 4/1997 | Jain | |
| 5,622,894 A | 4/1997 | Jang et al. | |
| 5,636,320 A | 6/1997 | Yu et al. | |
| 5,641,545 A | 6/1997 | Sandhu | |
| 5,702,982 A | 12/1997 | Lee et al. | |
| 5,705,419 A | 1/1998 | Perry et al. | |
| 5,711,998 A | 1/1998 | Shufflebotham | |
| 5,789,818 A | 8/1998 | Havermann | |
| 5,834,068 A | 11/1998 | Chern et al. | |
| 5,851,344 A | 12/1998 | Xu et al. | |
| 5,858,876 A | 1/1999 | Chew | |
| 5,869,902 A | 2/1999 | Lee et al. | |
| 5,872,058 A | 2/1999 | Van Cleemput et al. | |
| 5,897,370 A | 4/1999 | Joshi et al. | |
| 5,910,020 A | 6/1999 | Yamada | |
| 5,911,113 A | 6/1999 | Yao et al. | |

(Continued)

OTHER PUBLICATIONS

Papasouliotis et al., "Method of Chemical Modification of Structure Topography", U.S. Appl. No. 10/004,386, filed Dec. 3, 2001.

(Continued)

*Primary Examiner*—Bradley K. Smith
(74) *Attorney, Agent, or Firm*—Beyer Weaver & Thomas LLP

(57) ABSTRACT

Biased plasma etch processes incorporating H₂ etch chemistries. In particular, high density plasma chemical vapor etch-enhanced (deposition-etch-deposition) gap fill processes incorporating etch chemistries which incorporate hydrogen as the etchant that can effectively fill high aspect ratio gaps while reducing or eliminating dielectric contamination by etchant chemical species.

20 Claims, 6 Drawing Sheets

U.S. PATENT DOCUMENTS

| | | | |
|---|---|---|---|
| 5,913,140 | A | 6/1999 | Roche et al. |
| 5,920,792 | A | 7/1999 | Lin |
| 5,937,323 | A | 8/1999 | Orczyk et al. |
| 5,953,635 | A | 9/1999 | Andideh |
| 5,962,923 | A | 10/1999 | Xu et al. |
| 5,963,840 | A | 10/1999 | Xia et al. |
| 5,968,610 | A | 10/1999 | Liu et al. |
| 5,972,192 | A | 10/1999 | Dubin et al. |
| 6,027,663 | A | 2/2000 | Martin et al. |
| 6,030,881 | A | 2/2000 | Papasouliotis |
| 6,077,451 | A | 6/2000 | Takenaka et al. |
| 6,077,574 | A | 6/2000 | Usami |
| 6,106,678 | A | 8/2000 | Shufflebotham et al. |
| 6,124,211 | A | 9/2000 | Butterbaugh et al. |
| 6,136,703 | A | 10/2000 | Vaartstra |
| 6,184,158 | B1 | 2/2001 | Shufflebotham et al. |
| 6,200,412 | B1 | 3/2001 | Kilgore et al. |
| 6,211,065 | B1 | 4/2001 | Xi et al. |
| 6,232,196 | B1 | 5/2001 | Raaijmakers et al. |
| 6,265,269 | B1 | 7/2001 | Chen et al. |
| 6,277,764 | B1 | 8/2001 | Shin et al. |
| 6,331,494 | B1 | 12/2001 | Olson et al. |
| 6,335,261 | B1 | 1/2002 | Natzle et al. |
| 6,395,150 | B1 | 5/2002 | Van Cleemput et al. |
| 6,400,023 | B1 | 6/2002 | Huang |
| 6,410,446 | B1 | 6/2002 | Tsai et al. |
| 6,479,361 | B1 | 11/2002 | Park |
| 6,479,396 | B1 | 11/2002 | Xu et al. |
| 6,486,081 | B1 | 11/2002 | Ishikawa et al. |
| 6,500,728 | B1 | 12/2002 | Wang |
| 6,531,377 | B1 | 3/2003 | Knorr et al. |
| 6,566,229 | B1 | 5/2003 | Hong et al. |
| 6,569,777 | B1 | 5/2003 | Hsu et al. |
| 6,596,653 | B1 | 7/2003 | Tan et al. |
| 6,596,654 | B1 | 7/2003 | Bayman et al. |
| 6,599,829 | B1 | 7/2003 | Smith et al. |
| 6,642,105 | B1 | 11/2003 | Kim et al. |
| 6,706,541 | B1 * | 3/2004 | Toprac et al. .................. 438/7 |
| 6,737,334 | B1 | 5/2004 | Ho et al. |
| 6,787,483 | B1 | 9/2004 | Bayman et al. |
| 6,794,290 | B1 | 9/2004 | Papasouliotis et al. |
| 6,808,748 | B1 | 10/2004 | Kapoor et al. |
| 6,812,043 | B1 | 11/2004 | Bao et al. |
| 6,821,905 | B1 | 11/2004 | Pan et al. |
| 6,846,391 | B1 | 1/2005 | Papasouliotis et al. |
| 6,846,745 | B1 | 1/2005 | Papasouliotis et al. |
| 6,867,086 | B1 | 3/2005 | Chen et al. |
| 2001/0019903 | A1 | 9/2001 | Shufflebotham et al. |
| 2001/0044203 | A1 | 11/2001 | Huang et al. |
| 2002/0052119 | A1 | 5/2002 | Van Cleemput |
| 2002/0179570 | A1 | 12/2002 | Mathad et al. |
| 2003/0003244 | A1 | 1/2003 | Rossman |
| 2003/0003682 | A1 | 1/2003 | Moll et al. |
| 2003/0087506 | A1 | 5/2003 | Kirchhoff |
| 2003/0165632 | A1 | 9/2003 | Lin et al. |
| 2003/0203652 | A1 | 10/2003 | Bao et al. |
| 2003/0207580 | A1 | 11/2003 | Li et al. |
| 2004/0020894 | A1 * | 2/2004 | Williams et al. .............. 216/14 |
| 2004/0058549 | A1 | 3/2004 | Cai et al. |
| 2004/0082181 | A1 | 4/2004 | Doan et al. |
| 2004/0110390 | A1 | 6/2004 | Takagi et al. |
| 2004/0241342 | A1 | 12/2004 | Karim et al. |
| 2005/0074946 | A1 * | 4/2005 | Chu et al. .................. 438/424 |
| 2005/0130411 | A1 | 6/2005 | Bao et al. |
| 2005/0250346 | A1 | 11/2005 | Schmitt |

OTHER PUBLICATIONS

U.S. Office Action mailed Aug. 6, 2003, from U.S. Appl. No. 10/058,897.

U.S. Office Action mailed Jan. 29, 2004, from U.S. Appl. No. 10/058,897.

U.S. Office Action mailed May 21, 2004, from U.S. Appl. No. 10/058,897.

U.S. Office Action mailed Aug. 10, 2004, from U.S. Appl. No. 10/271,333.

U.S. Office Action mailed Apr. 14, 2004, from U.S. Appl. No. 10/271,333.

U.S. Office Action mailed Jun. 29, 2005, from U.S. Appl. No. 10/728,569.

Papasouliotis et al., "Hydrogen-Based Phosphosilicate Glass Process for Gap Fill of High Aspect Ratio Structures", Novellus Systems, Inc., filed Oct. 11, 2002, U.S. Appl. No. 10/271,333, pp. 1-28.

Guari et al., "Method of Preventing Structures Erosion During Multi-Step Gap Fill", Novellus Systems, Inc., filed Dec. 4, 2003, U.S. Appl. No. 10/728,569, pp. 1-29.

U.S. Office Action mailed Jan. 7, 2005, from U.S. Appl. No. 10/728,569.

U.S. Office Action mailed Nov. 6, 2002, from U.S. Appl. No. 09/996,619.

U.S. Office Action mailed Mar. 2, 2004, from U.S. Appl. No. 10/442,846.

Bayman et al., "Gap Fill For High Aspect Ratio Structures", Novellus Systems, Inc., filed Jul. 13, 2004, U.S. Appl. No. 10/890,655, pp. 1-24.

U.S. Office Action mailed Jul. 25, 2005, from U.S. Appl. No. 10/890,655.

U.S. Office Action mailed Nov. 17, 2005, from U.S. Appl. No. 10/316,987.

U.S. Office Action mailed Apr. 30, 2004, from U.S. Appl. No. 10/389,164.

Sutanto et al., "Method For Controlling Etch Process Repeatability", Novellus Systems, Inc., filed Sep. 2, 2003, U.S. Appl. No. 10/654,113, pp. 1-31.

U.S. Office Action mailed Jun. 17, 2004, from U.S. Appl. No. 10/654,113.

U.S. Office Action mailed Dec. 2, 2004, from U.S. Appl. No. 10/654,113.

U.S. Office Action mailed Mar. 31, 2005, from U.S. Appl. No. 10/654,113.

Bayman et al., "Process Modulation to Prevent Structure Erosion During Gap Fill", Novellus Systems, Inc., filed Sep. 7, 2004, U.S. Appl. No. 10/935,909, pp. 1-30

Papasouliotis et al., "Dynamic Modification of Gap-Fill Process Characteristics", Novellus Systems, Inc., filed Sep. 21, 2004, U.S. Appl. No. 10/947,424, pp. 1-25.

Hook et al., "The Effects of Fluorine on Parametrics and Reliability in a 0.18-µm 3.5/6.8 nm Dual Gate Oxide CMOS Technology", IEEE Transactions on Electron Devices, vol. 48, No. 7., Jul. 2001, pp. 1346-1353.

Shanker et al., "Hydrogen Treatment Enhanced Gap Fill", Novellus Systems, Inc., filed Mar. 16, 2005, U.S. Appl. No. 11/082,369, pp. 1-33.

Papasouliotis et al., "Deposition Profile Modification Through Process Chemistry", Novellus Systems, Inc., filed Dec. 9, 2002, U.S. Appl. No. 10/316,987, pp. 1-35.

U.S. Office Action mailed Jan. 27, 2005, from U.S. Appl. No. 10/316,987.

U.S. Office Action mailed Jul. 14, 2005, from U.S. Appl. No. 10/316,987.

Lang et al., "Helium-Based Etch Process in Deposition-Etch-Deposition Gap Fill", Novellus Systems, Inc., filed Jun. 22, 2005, U.S. Appl. No. 11/159,834, pp. 1-29.

Lang et al., "Strain Engineering—HDP Thin Film With Tensile Stress For FEOL and Other Applications", Novellus Systems, Inc., filed Nov. 17, 2004, U.S. Appl. No. 10/991,890, pp. 1-35.

U.S. Office Action mailed Oct. 18, 2005, from U.S. Appl. No. 10/947,424.

Lang et al., "Using Water (H20) To Replace Oxygen (02) In A Silicon Dioxide (Si02) Thin Film Deposition Process for HDP STI Technology", Novellus Systems Inc., filed Nov. 9, 2005, U.S. Appl. No. 11/272,487, pp. 1-25.

U.S. Office Action mailed Dec. 14, 2005, from U.S. Appl. No. 10/728,569.

Nguyen et al., "Halogen-Free Noble Gas Assisted $H_2$ Plasma Etch Process in Deposition-Etch-Deposition Gap Fill", Novellus Systems, Inc., filed Mar. 1, 2006, Application No. Not yet assigned.

U.S. Office Action mailed Feb. 16, 2006, from U.S. Appl. No. 11/082,369.

U.S. Office Action mailed Jun. 1, 2006, from U.S. Appl. No. 10/728,569.

* cited by examiner

BIASED H₂ ETCH PROCESS IN DEPOSITION-ETCH-DEPOSITION GAP FILL

BACKGROUND OF THE INVENTION

This invention relates to semiconductor device fabrication processes. More specifically, the invention relates to plasma-based chemical vapor deposition and etch processes for forming dielectric layers, particularly in high aspect ratio, narrow width recessed features.

It is often necessary in semiconductor processing to fill high aspect ratio gaps with insulating material. This is the case for shallow trench isolation, inter-metal dielectric layers, passivation layers, etc. As device geometries shrink and thermal budgets are reduced, void-free filling of narrow width, high aspect ratio (AR) spaces (e.g., AR>3:1) becomes increasingly difficult due to limitations of existing deposition processes.

The deposition of silicon dioxide ($SiO_2$) assisted by high-density plasma chemical vapor deposition (HDP CVD)—a directional (bottom-up) CVD process—has become the preferred method for high aspect ratio gap fill. The method deposits more material at the bottom of a high aspect ratio structure than on its sidewalls. It accomplishes this by directing charged dielectric precursor species downward, to the bottom of the gap. Thus, HDP CVD is not an entirely diffusion-based (isotropic) process.

An etch-enhanced (deposition-etch-deposition) gap fill technique which involves a sequence of deposition, etch and deposition steps using an HDP reactor has been developed to maintain the opening at the top of the gap wide enough for a subsequent deposition(s) to completely fill the gap. Such processes are described, for example, in U.S. Pat. Nos. 6,335,261 and 6,030,881, the disclosures of which are incorporated herein by reference for all purposes. A typical 3-step etch-enhanced process can be described as follows: First step—Deposition 1: a partial deposition of SiO2 thin film is conducted to obtain maximum bottom-up gap fill with the gap remaining unclosed; second step—Etch: in-situ etch back is carried out to remove depositions on the top and sidewall of the trench lines and keep the mouth of the gap open enough for the next deposition step with minimum bottom-up deposition loss; and, third step—Deposition 2: deposition of $SiO_2$ film is carried out to further fill the partially filled gap to completion. In some cases it may be necessary to conduct additional etch and deposition steps to completely fill the gap.

The etch component of these etch-enhanced gap fill processes typically uses a fluorine-based etchant, such as $NF_3$, $CF_4$ or $C_2F_6$, etc., to achieve a fast etch rate. However, the application of those etchants may contaminate the dielectric (e.g., STI) film with foreign atoms, e.g., C, N and F, causing issues in the subsequent integration processes and device degradation.

Therefore, an etch-enhanced gap fill process that avoided the use of etchants which tend to contaminate the deposited dielectric film would be desirable.

SUMMARY OF THE INVENTION

The present invention addresses this need by providing chemical vapor deposition and biased etch back processes that replace fluorine-based etchants with hydrogen. In particular, the invention provides a high density plasma chemical vapor etch-enhanced gap fill process using hydrogen as an etchant that can effectively fill high aspect ratio (typically at least 3:1, for example 6:1, and up to 10:1 or higher), narrow width (typically sub 0.11 micron, for example 0.1 micron or less) gaps while reducing or eliminating dielectric contamination by etchant chemical species.

Suitable plasma reactors, e.g., Novellus Speed, with inductively coupled plasma (ICP) sources are available to accomplish both deposition and etch steps of the etch-enhanced gap fill process of the present invention in a single plasma reactor chamber. The deposition part of the process may involve the use of any suitable high density plasma chemical vapor deposition (HDP CVD) chemistry.

The process results in the formation of a dielectric film free of contamination by etchant chemical species.

In one aspect, the invention pertains to a method of filling gaps on a semiconductor substrate. The method involves partially filling a gap on a semiconductor substrate with dielectric using a high density plasma chemical vapor deposition process, partially removing dielectric deposited in the gap from the gap opening by a biased etch back process conducted with hydrogen as etchant, and further filling of the partially filled gap by HDP CVD.

In another aspect, the invention pertains to a method of etching dielectric on a semiconductor substrate. The method involves partially removing dielectric on the substrate by a biased etch back process conducted with hydrogen as etchant.

These and other features and advantages of the present invention are described below where reference to the drawings is made.

DETAILED DESCRIPTION OF SPECIFIC EMBODIMENTS

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

The present invention relates to chemical vapor deposition and biased etch back processes that replace fluorine-based etchants with hydrogen. In particular, the invention provides a high density plasma chemical vapor etch-enhanced gap fill process using hydrogen as the etchant that can effectively fill high aspect ratio (typically at least 3:1, for example 6:1, and up to 10:1 or higher), narrow width (typically sub 0.11 micron, for example 0.1 micron or less) gaps while reducing or eliminating dielectric contamination by etchant chemical species.

Suitable plasma reactors, e.g., Novellus Speed, with inductively coupled plasma (ICP) sources are available to accomplish both deposition and etch steps of the etch-enhanced gap fill process of the present invention in a single plasma reactor chamber. The gap fill process of the present invention may also be accomplished in a plurality of processing chambers. The deposition part of the process may involve the use of any suitable high density plasma chemical vapor deposition (HDP CVD) chemistry.

The process results in the formation of a dielectric film free of contamination by etchant chemical species.

Etch-Enhanced Gap Fill Process

Figure 1A:
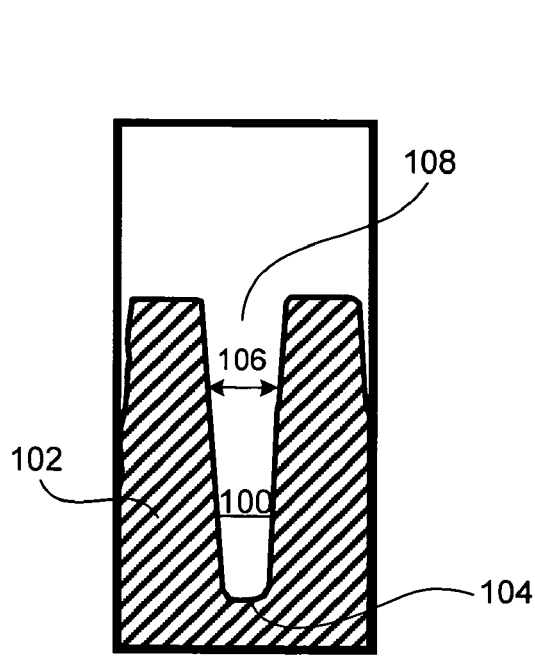
FIGS. 1A–D depict rough schematic cross-sectional diagrams of an etch-enhanced gap fill process in accordance with the present invention.

FIGS. 1A–D depict rough schematic cross-sectional diagrams of a multi-step, etch-enhanced gap fill process in accordance with the present invention. FIG. 1A depicts a trench (gap) 100 on a semiconductor substrate 102 requiring filling with a dielectric. The gap may be defined by its features, namely its bottom 104, sidewalls 106 and entry region (top) 108. The gap 100 is generally lined with a barrier layer, such as thermal silicon dioxide ($SiO_2$) and ($Si_3N_4$) silicon nitride. As such, a thin layer (e.g., 10–200 Å, for example 100 Å) of silicon dioxide is formed on the gap bottom 104 and sidewalls 106 prior to being filled with bulk dielectric. A pad nitride also generally exists at the entry region 108, on the substrate surface surrounding the gap 100.

The present invention, while applicable to the filling of any gap requiring dielectric fill, is particularly suited to gap fill of high aspect ratio, narrow width gaps. For example, the gap 100 may have a high aspect ratio, for example about 6:1 and a narrow width, for example about 1000 Å.

Figure 1B:
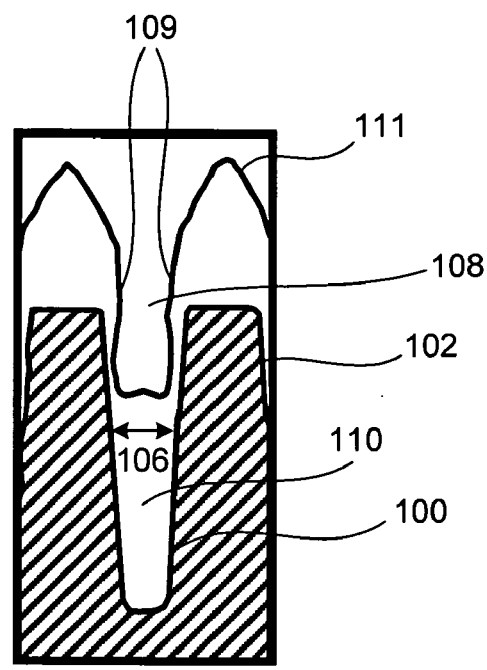

In an initial step in a multi-step gap fill process in accordance with the present invention, the gap 100 is partially filled with a dielectric 110 deposited by high density plasma (HDP) chemical vapor deposition (CVD) process, as shown in FIG. 1B. The dielectric may be composed of any suitable material including doped (e.g., with fluorine, phosphine or phosphine and borine) or un-doped $SiO_2$ or $Si_3N_4$, PSG BPSG or FSG. The present invention may be particularly useful in applications where undoped dielectrics (e.g., $SiO_2$) are desirable, for example, in some FLASH memory devices. Generally, a high density plasma is any plasma having electron density of at least about $1 \times 10^{12}$ electrons per cubic centimeter. Typically, though not necessarily, high density plasma reactors operate at relatively low pressures, in the range of 100 mTorr or lower, and generally below 30 mTorr.

The deposition process gas will have a particular composition represented by flow rates of the constituent gases in units of standard cubic centimeter per minute (sccm). The process gas will include a precursor for the deposition layer. If the dielectric is a silicon-containing dielectric, like silicon dioxide ($SiO_2$), then the process gas will include a silicon-bearing compound. Examples of silicon-containing dielectric precursors are well known in the art and include $SiH_4$, $SiF_4$, $Si_2H_6$, TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof. Where the purity of the dielectric is an issue, inorganic, non-fluorine-containing precursors for $SiO_2$, such as $SiH_4$ and $Si_2H_6$, are preferred. During deposition, the process decomposes the silicon-containing reactant to form a silicon-containing gas and plasma phase species, which can react on the surface of the substrate.

The process gas will also generally include a carrier gas. The carrier gas may be an inert gas, such as He, Ar and/or other noble gases. Or the carrier gas may be or include elemental or molecular hydrogen.

Oxygen to form the silicon dioxide or other dielectric material may be provided by the silicon-containing precursor itself or from another process gas such as oxygen ($O_2$), nitric oxide (NO), and/or nitrous oxide ($N_2O$). Again, where the purity of the dielectric is an issue, oxygen ($O_2$) is the preferred oxygen source.

Typical flow rate ranges for deposition process gases of the present invention are listed below.

| Gas | Flow Rate (sccm) |
| --- | --- |
| $SiH_4$ | 10–300 |
| $O_2$ | 20–1000 |
| He | 0–500 |
| $H_2$ | 0–5000 |

Generally, other oxygen and silicon-containing compounds can be substituted for those listed in this table. Depending upon the atom counts in the precursor gases, the flow rate ranges may have to be changed. While there are no precise rules for modifying flow rates as a function of molecular structure, generally the flow rate of the silicon-containing precursor may be reduced by a factor corresponding to the number of silicon atoms in the molecule. So, for example, if the molecule contains two silicon atoms, one may expect to reduce the flow rate of the silicon-containing precursor to a level of between about 5 and 150 sccm.

Reactor pressure is held at a value necessary to sustain the high-density plasma. Preferably the process vessel is maintained at a pressure of at most about 100 mTorr. In some cases, the process chamber pressure is maintained below 1 mTorr. For many applications, however, the pressure is maintained between about 1 and 100 mTorr; most preferably between about 1 and 30 mTorr.

The temperature within the process vessel should be maintained sufficiently high to ensure that the dielectric deposition reaction proceeds efficiently. Hence, the temperature preferably resides at values between about 30 and 1000° C. This temperature will vary depending upon the types of precursors employed in the reaction. Further, the temperature may be limited by process constraints, such as thermal budget limitations that preclude temperatures above 700–750° C. Such constraints become increasingly common with advanced technologies and corresponding smaller feature sizes. For such applications, the process temperature is preferably maintained between about 30 and 750° C. In particularly preferred embodiments, the substrate temperature is maintained between about 300 and 700° C., even more preferably between about 350 and 650° C.

As indicated, to control the substrate temperature, the reactor may supply a heat transfer gas between a surface of the substrate and a surface of the substrate holder on which the substrate is supported during film deposition. The heat transfer gas may include at least one of helium and argon. The back-side helium pressure is set by the temperature requirements of the process (a typical range being between 0–15 Torr).

For some applications, it may be desirable to preheat the wafer to a pre-specified relatively low temperature and then gradually raise the temperature. This allows for isothermal operation. The goal is to start the deposition and then maintain the wafer temperature within a narrow range during the entire deposition process.

The low frequency power applied to the induction coil typically varies from 1 kW to 20 kW, and the high frequency power (for biasing the wafer) typically varies from 0.5 kW to 10 kW depending on the substrate size (e.g., 200 or 300 mm diameter) and the requirements of the specific process being used.

The power source applied to the induction coil and substrate electrode is typically a radio frequency source. Applying radio frequency bias to the substrate involves supporting the substrate on a substrate holder having an electrode supplying a radio frequency bias to the substrate. For many embodiments, the radio frequency bias applied to the substrate is at the frequency range of between about 100 kHz and 27 MHz. The power source applied to the induction coil typically has a frequency range between about 300 kHz and 1 MHz. In a preferred embodiment, the deposition process chemistry is as follows:

| Gas | Flow Rate (sccm) |
|---|---|
| $SiH_4$ | 80 |
| He | 200 |
| $H_2$ | 100 |
| $O_2$ | 110 |

The low frequency coil is powered at 3000W and the high frequency substrate electrode is powered at 800W. Further details of suitable HDP CVD deposition process gas chemistries are provided below.

The HDP CVD deposition results in beneficial filling of the trench from the bottom 104 up. However, there is still some problematic top and sidewall deposition resulting in narrowing of the entry region 108 of the gap 100 by the formation of an overhang 109 and the formation of a dielectric peak (the so-called "top-hat" feature) 109 on either side of the gap opening. This results from the non-directional deposition reactions of neutral species in the plasma reactor and from sputtering/redeposition processes. The overhang 109 and top-hat 111 features exacerbate the difficulties of filling the high aspect ratio gap.

To address these problems, following this initial deposition stage of the process, the detrimental overhang 109 is removed and the top-hat 111 substantially reduced in an etch back stage of the process to facilitate further void free filling of the trench in a subsequent deposition stage. In a preferred embodiment, the etch back process is carried out in the same reactor chamber as the deposition.

$H_2$ as Etchant

According to the present invention, hydrogen is used as an etching agent to replace conventional F-containing etchants in a biased etch back stage of the gap fill process. $H_2$ is introduced into the deposition chamber and ionized by source plasma power in the chamber. The ionized hydrogen acts as an etchant for deposited dielectric film on all exposed surfaces of the substrate 102 on which the gap 100 is being filled. In accordance with the present invention, $H_2$ is the only etchant in the etch process chemistry; the etch process chemistry also generally includes a carrier gas, in particular He, but no other etchant (e.g., F-based etchant) is used.

Figure 1C:
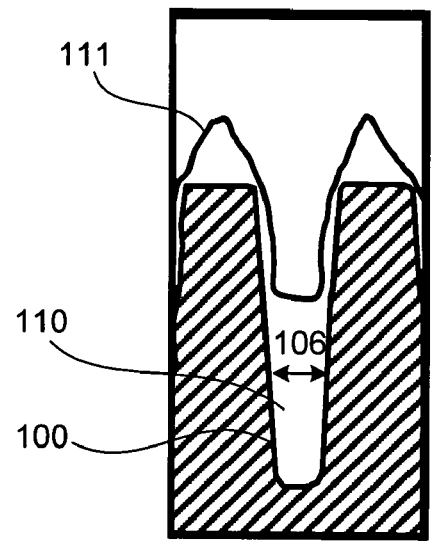

In the biased etch back stage, the wafer is biased and exposed to a plasma, for example, a radio frequency based inductively coupled plasma, containing $H_2$ etchant chemistry. As shown in FIG. 1C, there is partial removal of deposited dielectric film, primarily in the overhang and top-hat areas at the top of the gap, by the biased $H_2$ etch. This biased $H_2$ etching leads to efficient removal of unnecessary deposition at and adjacent to the gap opening in order to maintain the gap open enough for a complete gap fill in a subsequent HDP CVD deposition stage(s) of the multi-step process.

The chuck may be biased with a power range of about 500 to 7000W. Biasing the chuck imparts some directionality to the etch plasma towards the wafer on the biased chuck. Thus, while the etch process of the present invention has a dominant isotropic character, it does favor the biased wafer/chuck. Increase in bias power enhances etch rate, but does not significantly alter the isotropic characteristic of $H_2$ etch. This is observed by the conservation of bottom-up deposition even with high bias power $H_2$ etch processing. This process advantage shows that H+ is small enough to cause negligible bombardment/sputtering of the dielectric material that is normal to the incoming H+ ions, while efficient in removing the "top-hat" area that is about 45–60° to the incoming H+ ions. The biased etch process is referred to herein as substantially isotropic. In some preferred embodiments, the chuck is biased with about 500–5000 W.

The etch plasma chemistry includes only hydrogen ($H_2$) as an etchant. The etch plasma chemistry may consist of H2 alone, or it may include an inert carrier gas, which may be He, Ar or $N_2$, with He being preferred. $O_2$ may optionally be included in the etch chemistry, but should only be used to the extent necessary to achieve plasma stability since its addition enhances the redeposition effect.

An $H_2$/He-based etch chemistry is preferred in one embodiment of the invention. Typical process parameter ranges for inductively coupled plasma process gases in accordance with the present invention and reactor conditions are listed as follows:

| Wafer temp (° C.) | 250–700 |
|---|---|
| $H_2$ (sccm) | 300–2000 |
| He (sccm) | 50–1000 |
| $O_2$ (sccm) | 0–500 |
| Pressure (mTorr) | 0.2–100 |
| Bias (HF RF) Power (W) | 500–7000 |
| Source (LF) Power (W) | 2000–7000 |

In a specific embodiment, the biased etch process chemistry and reactor conditions are as follows:

| Wafer temp (° C.) | 650 |
|---|---|
| $H_2$ (sccm) | 800 |
| He (sccm) | 300 |
| $O_2$ (sccm) | 0 |
| Pressure (mTorr) | 7.0 |
| Bias (HF RF) Power (W) | 3000 |
| Source (LF) Power (W) | 4000 |

The conditions are preferably set so that the etch is selective for the HDP CVD deposited dielectric (e.g., $SiO_2$) relative to the silicon nitride barrier layer lining the trench and the hard mask (the pad nitride on the substrate surface surrounding the gap opening) so that neither is exposed and clipped by the etch. Adjustment of the process selectivity is within the skill in the art given the process parameters and description provided herein.

Figure 1D:
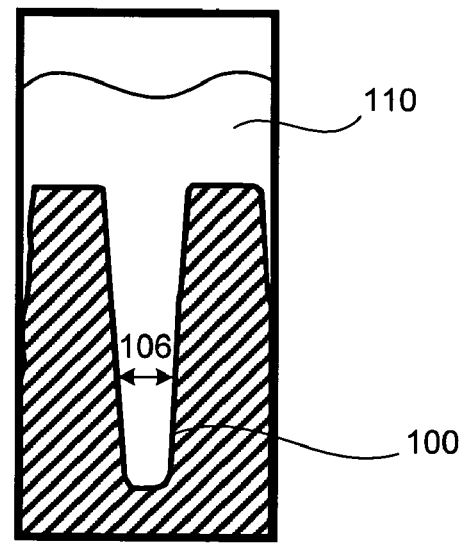

Following the biased etch back stage, an additional HDP CVD deposition is performed in order to further fill the gap 100 with dielectric 110, as shown in FIG. 1D. The etch back and deposition steps depicted in FIGS. 1C and 1D may be repeated, as necessary, until the gap is filled. For a gap with about a 6:1 aspect ratio and about a 1000 Å width, three to five, for example four, iterations of the etch back and deposition steps are typical to obtain void free filling of the gap.

Figure 2:
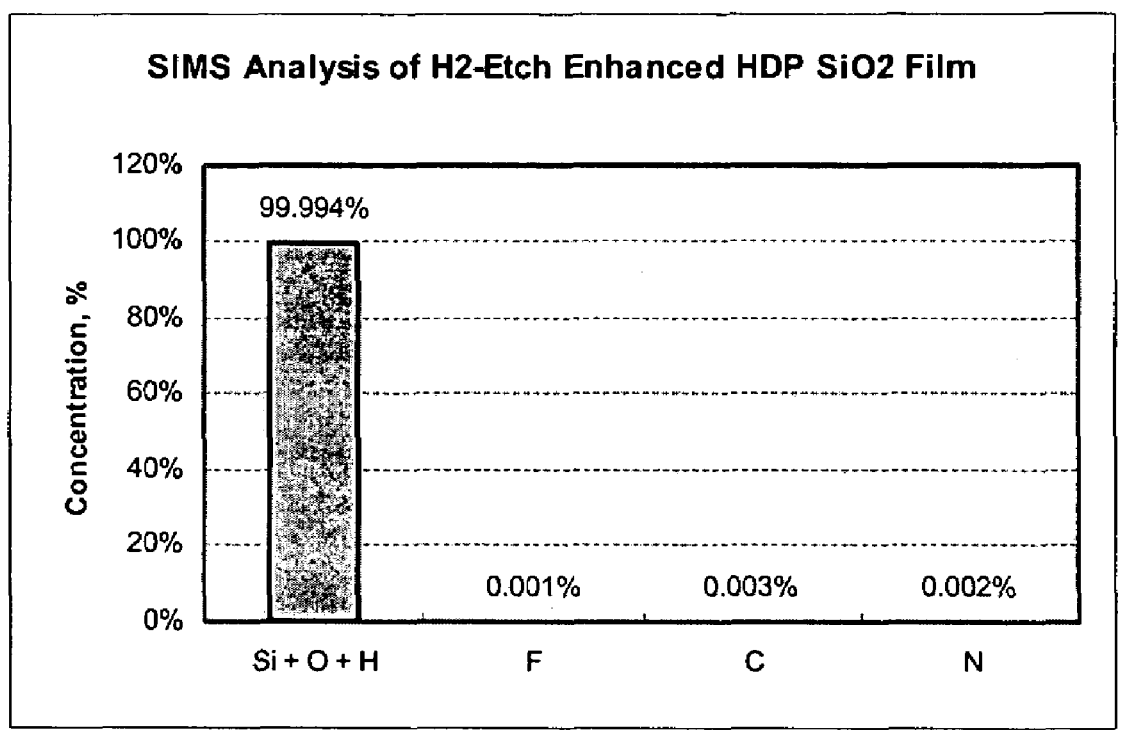
FIG. 2 depicts a SIMS analysis plot showing C, N and F content in an HDP film deposited using an $H_2$-etch enhanced gap fill process in accordance with one embodiment of the present invention.
Figure 3:
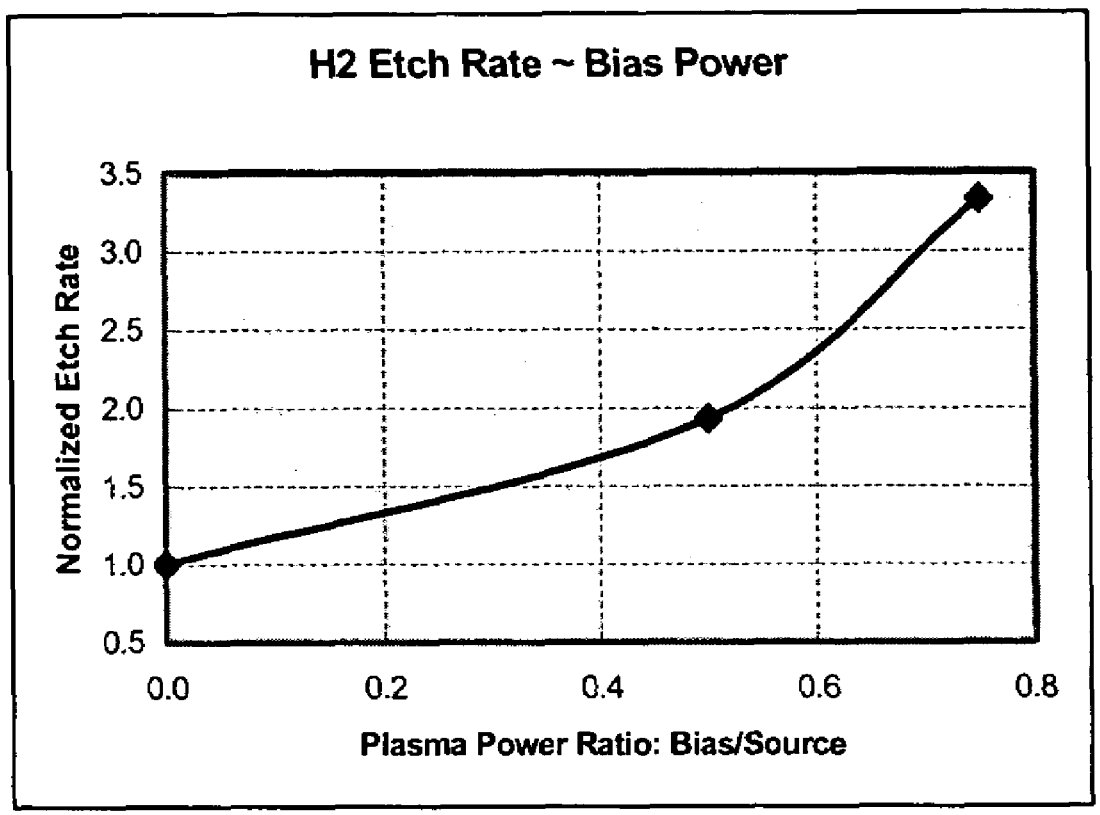
FIG. 3 depicts a plot showing in situ $H_2$ etch rate vs. applied bias power for an $H_2$-etch enhanced gap fill process in accordance with one embodiment of the present invention.
Figure 4:
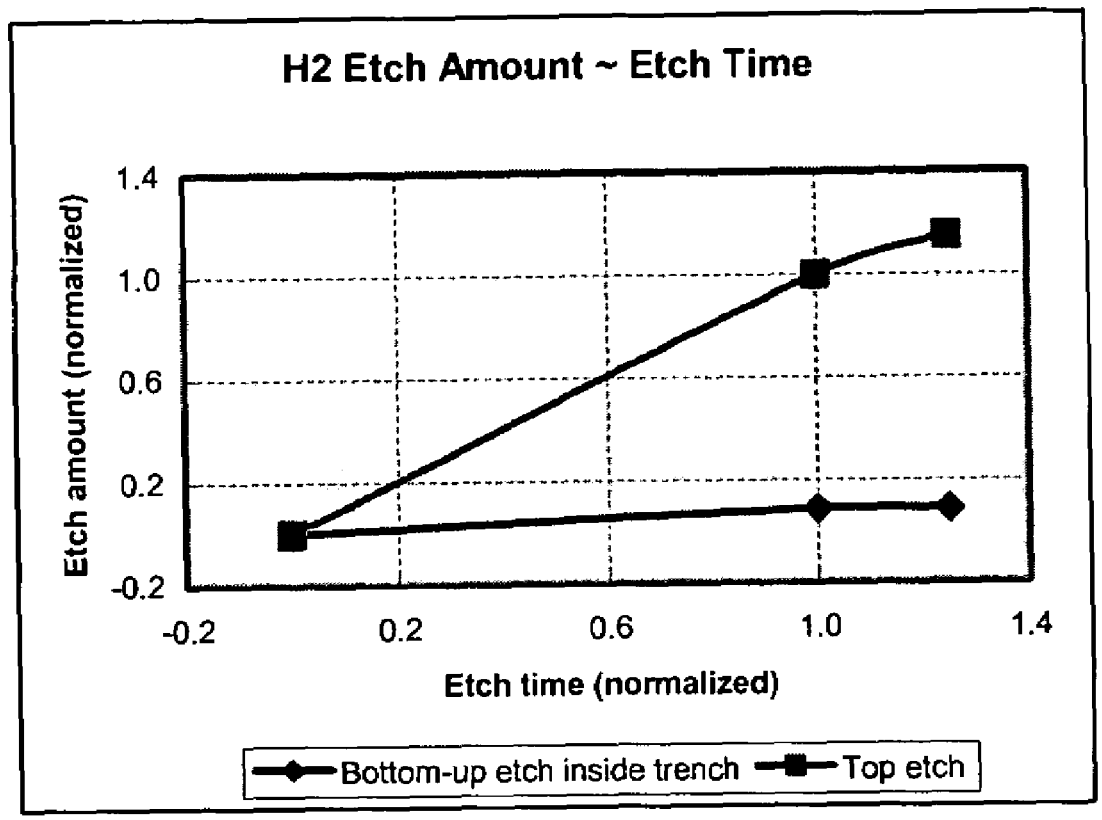
FIG. 4 depicts a plot showing in situ $H_2$ etch amount at two different areas vs. etch time for an $H_2$-etch enhanced gap fill process in accordance with one embodiment of the present invention.

Without limiting the invention described and claimed herein, some beneficial effects of the use of hydrogen as an etchant in accordance with the present invention are illustrated with reference to FIGS. 2–4.

The $H_2$ etchant has the important advantage that there is virtually no contamination of the dielectric with C, N and F from etching chemicals in an etch-enhanced gap fill process because only $H_2$ is used as an etchant. FIG. 2 gives the secondary ion mass spectroscopy (SIMS) analysis result of an HDP film formed using the biased $H_2$ etch-enhanced gap fill process noted below showing that there is only trace amount of C (30 ppm), N (20 ppm) and F (10 ppm) contained in the film relative to the $SiO_2$ film density of 7E+22 atoms/cc.

| Biased H2 - Etch Enhanced deposition conditions for SIMS analysis sample | | | |
|---|---|---|---|
| Parameter | Deposition 1 | Etch | Deposition 2 |
| Wafer temp (° C.) | 550 | 650 | 650 |
| SiH4 (sccm) | 80 | | 80 |
| $H_2$ (sccm) | 100 | 800 | 100 |
| He (sccm) | 200 | 300 | 2000 |
| $O_2$ (sccm) | 110 | 0 | 110 |
| Pressure (mTorr) | 2.5 | 7.0 | 2.5 |
| Bias (HF RF) Power (W) | 1100 | 3000 | 3100 |
| Source (LF) Power (W) | 3000 | 4000 | 3000 |

In addition, application of bias power to the wafer leads more etching radicals to move towards the etched target (wafer) so that etch back is enhanced. As shown in FIG. 3, etch rate increases with increase of the bias power.

Another advantageous characteristic of the biased $H_2$ etch-enhanced gap fill process of the invention is that etch-induced bottom-up deposition loss is minimum. This is illustrated in FIG. 4 which depicts etch amount inside and outside of a trench vs. etch time. Thus, as previously illustrated in FIG. 1, biased $H_2$ etch back of deposition on the trench top (overhang and top-hat) is much faster than that inside the trench. This is desirable to minimize gap fill deposition loss during the etch stage of the multi-step process. Secondly, etch amount of deposition on the trench top increases with time, while it remains unchanged for the bottom-up gap fill at the normalized time $\geq 1.0$.

Thus, this invention provides an etch-enhanced HDP gap fill (e.g., STI) process with an in situ high throughput $H_2$ etch step without C, N and F contamination.

Implementation: Plasma Processing Reactor

Various plasma reactor designs are suitable for use with this invention. The particular design is not critical to this invention. It merely needs to support HDP CVD dielectric layer formation and etch back on appropriate substrates. Examples of suitable reactors include the Novellus SPEED reactor, available from Novellus Systems, Inc. of San Jose, Calif., and the Ultima reactor, available from Applied Materials, Inc. of Santa Clara, Calif.

The principal components of most suitable reactors include a reaction chamber, a process gas delivery system, a support for the substrate, one or more electrodes or radio frequency power source coupled to an induction coil to generate an inductively coupled plasma, and a bias source for the substrate. A temperature control system is typically used to heat the substrate. Suitable plasma processing reactors and described, for example, in U.S. Pat. Nos. 5,346,578, 5,405,480 and 5,605,599, the disclosures of which are incorporated by reference herein in their entirety and for all purposes.

Figure 5A:
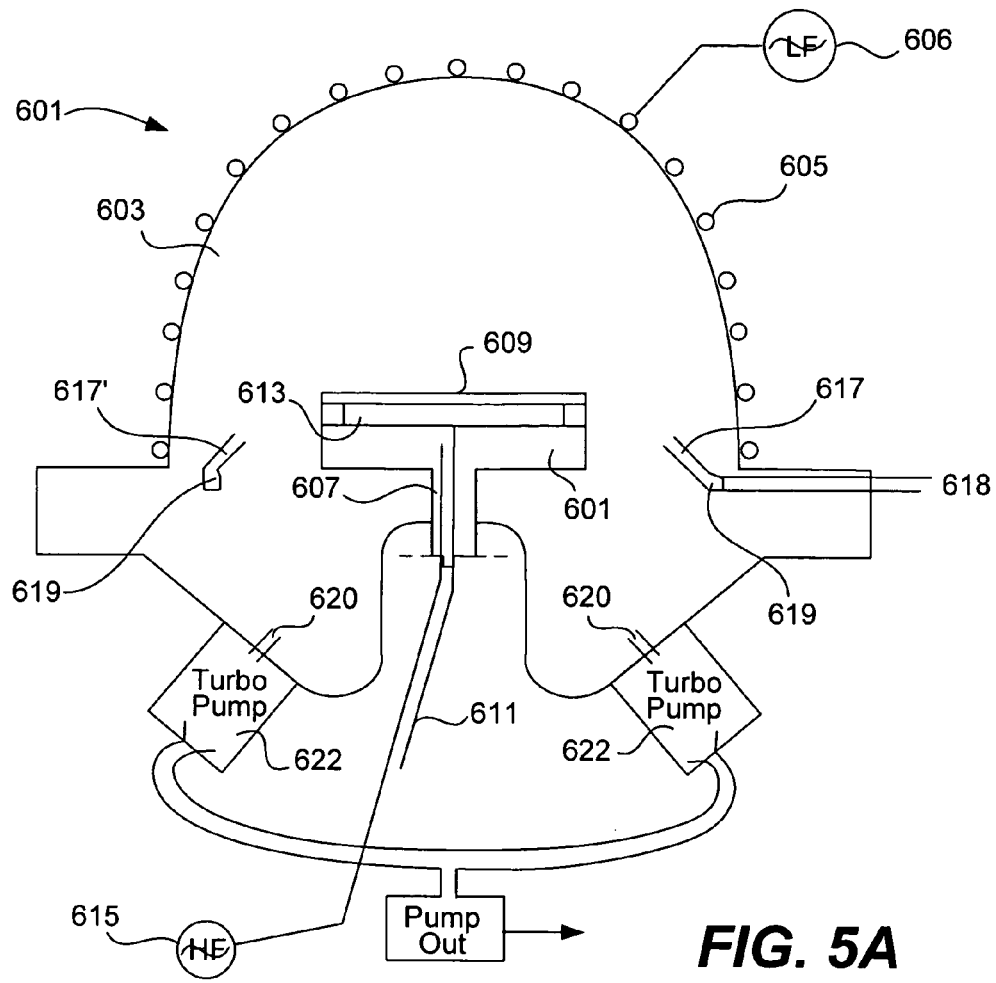
FIG. 5A is a vertical cross-sectional block diagram depicting some components of a plasma processing system suitable for conducting a dep-etch-dep gap fill process in accordance with the present invention.

FIG. 5A is a vertical cross-section block diagram depicting some components of a suitable plasma processing reactor suitable for conducting an $H_2$ etch-enhanced gap fill process in accordance with the present invention on semiconductor wafers. As shown, the reactor 601 includes a process chamber 603 which encloses other components of the reactor and serves to contain the plasma generated by the radio frequency power source coupled to the induction coil 605 which surrounds the chamber on or embedded in the chamber walls. In one example, the process chamber walls are made from aluminum, aluminum oxide, and/or other suitable material. The coil 605 is powered by a "low frequency" radio frequency (RF) source 606. The power and frequency supplied by source 606 is sufficient to generate high-density plasma from the process gas.

Within the reactor, a wafer pedestal 607 supports a substrate 609. The pedestal typically includes a chuck 608 to hold the substrate in place during the deposition reaction. The chuck may be an electrostatic chuck, a mechanical chuck or various other types of chuck as are available for use in the industry and/or research.

A heat transfer subsystem including a line 611 for supplying a heat transfer gas controls the temperature of substrate 609. In some embodiments, the heat transfer fluid comprises at least one of helium and argon gas. The heat transfer fluid is supplied to a space 613 between the surface of the substrate and a surface of the chuck.

A "high frequency" RF source 615 serves to electrically bias substrate 609 and draw charged precursor species onto the substrate for the deposition or etch reactions. Electrical energy from source 615 is coupled to substrate 609 via an electrode or capacitive coupling, for example. Note that the bias applied to the substrate need not be an RF bias. Other frequencies and DC bias may be used as well. In a specific embodiment, source 615 supplies a radio frequency bias to the substrate with a power ranges from 0.5 kW to 10 kW.

Figure 5B:
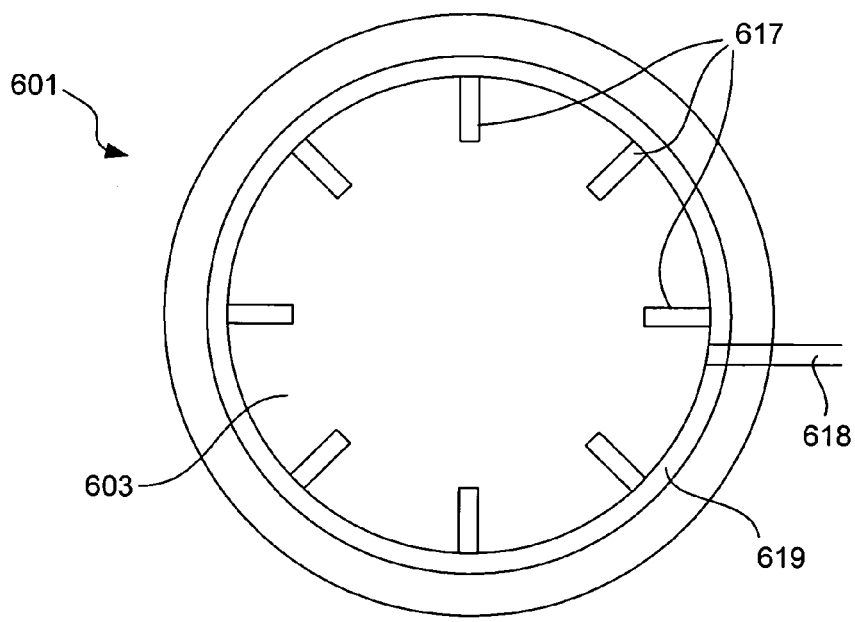
FIG. 5B is a horizontal cross-section schematic diagram of the plasma processing system of FIG. 5A.

The process gases are introduced via one or more chamber inlets 617. The gases may be premixed or not. A source of hydrogen gas provides hydrogen for the deposition and etch process gas. Other sources of dielectric precursor gases and carrier gases are also provided. Preferably, the process gas is introduced through a gas supply inlet mechanism including orifices. The gas or gas mixture may be introduced from a primary gas ring, which may or may not direct the gas toward the substrate surface. In this embodiment, a ring inlet(s) 618 is connected to the primary gas ring 619 to supply gas or gas mixture into the chamber via the chamber inlets 617. This arrangement is further illustrated in the horizontal cross-section of FIG. 5B which depicts a ring inlet and eight chamber inlets for process gas. Note that inlets, gas rings or other mechanisms for supplying process gas to the reactor process chamber are not critical to this invention. The sonic front caused by the gas entering the chamber will itself cause the gas to rapidly disperse in all directions—including toward the substrate.

The process gas exits the chamber 603 via an outlet or outlets 620. A vacuum pump (e.g., a turbomolecular pump) or pumps 622 typically draws the gas out and maintains a suitably low pressure within the reactor.

As noted above, the gap fill process of the present invention is preferably accomplished in a single reactor process chamber, but it may also be accomplished in a plurality of processing chambers. When more than one processing chamber is used, a pressure controlled transfer module should be used to transfer the wafers from one chamber to another. Such transfer modules and procedures are known to those of skill in the art.

Process Parameters

Figure 6:
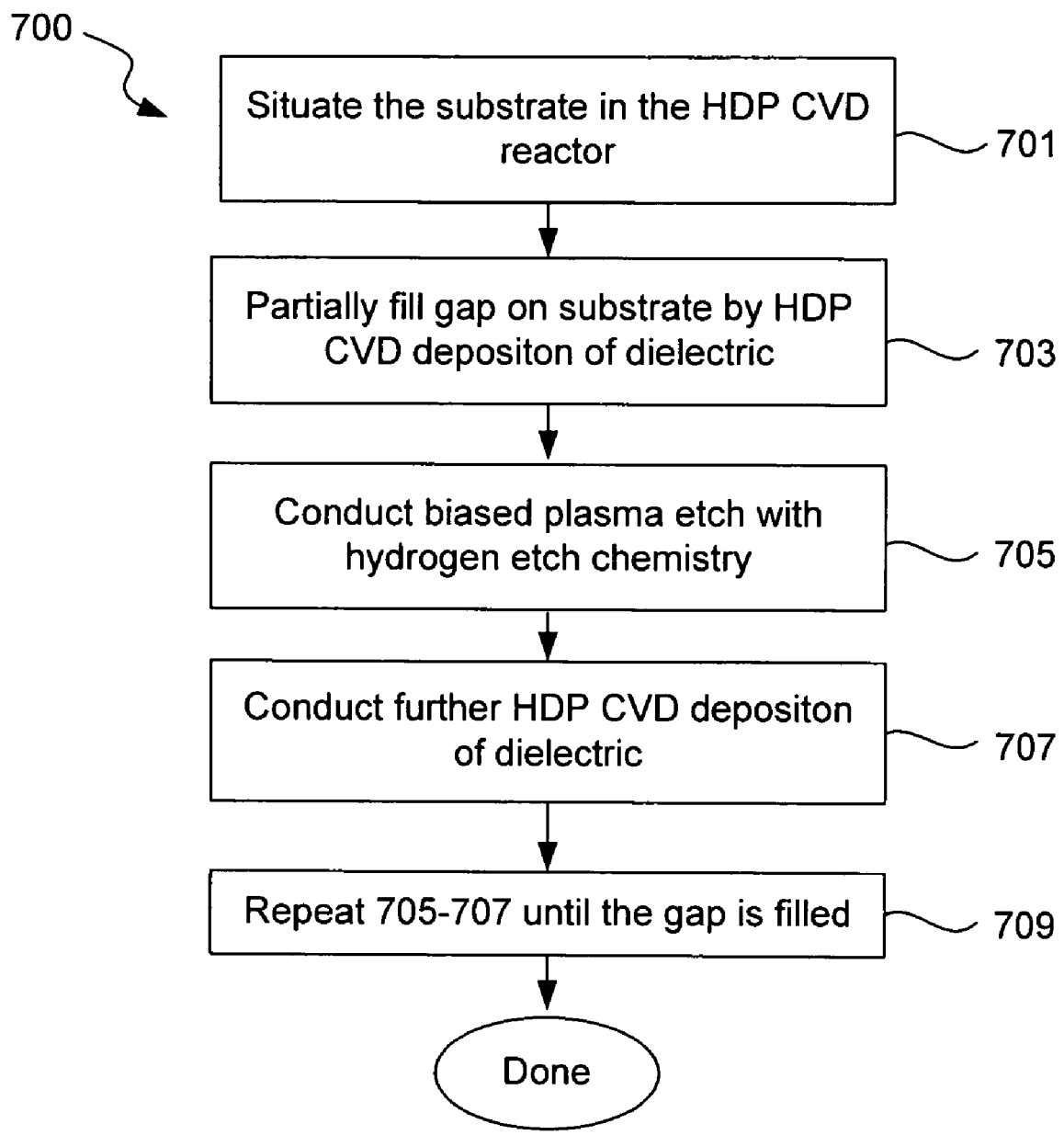
FIG. 6 is a process flow diagram depicting a process context of the present invention.

FIG. 6 is a process flow diagram (700) depicting a process context of the present invention. Reference is made to the system depicted in FIG. 5A throughout the description of this process flow as a sample context for implementation of the invention. A substrate requiring gap filling, such as a semiconductor wafer, is situated in an HDP CVD reactor (701).

A deposition process begins with an electrical subsystem applying electrical energy of appropriate power and frequency to one or more electrodes of a process chamber of the reactor. The power and frequency are chosen to generate a high density plasma in the chamber, given the process gas concentration, pressure, and other process parameters. Providing the substrate to the reactor may involve clamping the substrate to a pedestal or other support in the chamber. For this purpose, an electrostatic or mechanical chuck may be employed.

After the wafer is appropriately situated in the chamber, a gap on the substrate is partially filled by HDP CVD deposition of dielectric (703). The process adjusts the substrate temperature to a level promoting the deposition of the dielectric layer. Typically, this temperature is between about 30–1000° C. (more preferably about 300 to 680° C., for example 450–550° C.). The temperature control mechanism may gradually raise the temperature during deposition or it may preheat the wafer to first drive out certain interfering species. During deposition, the temperature may be maintained by supplying a heat transfer gas between a back surface of the substrate and a surface of the substrate holder on which the substrate is supported during the film growth operation.

The reactor system introduces a process gas to the reaction chamber via an inlet. The process gas includes dielectric precursor species such as high vapor pressure silicon-containing compounds. Molecular oxygen or another oxygenated compound will often be present. A carrier gas is also generally present. The carrier gas may be an inert carrier gas such as helium. However, in high aspect ratio gap fill applications the carrier gas preferably is or includes molecular or elemental hydrogen which inhibits precursor dissociation and promotes bottom-up gap fill. All the process gas components are introduced at specified flow rates.

An electrical subsystem applies a bias to the substrate, to thereby direct charged precursor species from the plasma onto the substrate and grow a dielectric film. Note that the substrate itself serves as an electrode here. Its bias accelerates charged species to it. Typically, the substrate electrode is powered by a high frequency RF bias and the induction coil is powered by a lower frequency RF source.

Dielectric is deposited in the gap or gaps on the substrate to a desired thickness, generally at the point where the overhang that forms at the gap entry point prevents further effective filling of the gap (703).

After finishing the deposition step, the flow of deposition chemistry is turned off and the hydrogen ($H_2$) etchant chemistry is introduced to the reaction chamber via an inlet. The $H_2$ etchant gas should dissociate at a controlled rate consistent with isotropic etching. An $H_2$/He (carrier)-based etch chemistry is typically used. Molecular oxygen may also be present in the etchant chemistry, but should be minimized. All the process gas components are introduced at specified flow rates within the parameters noted above. In a specific embodiment, the isotropic etch is conducted using an inductively coupled plasma source in the reactor. The RF bias power applied to the substrate in the reactor is adjusted to between about 500 and 5000W, for example 3000W. It should be noted that the inductively coupled plasma (ICP) etch may alternatively be accomplished by a downstream microwave plasma etch. The etch back process preferentially removes dielectric overhang and top-hat features at the gap opening thereby decreasing the gap's aspect ratio and facilitating further filling in subsequent deposition processing.

Following the etch, etch process chemistry flows are turned off and further deposition process for filling the remaining gap is performed (707) by introducing the deposition process gases into the reactor. The etch back and deposition process (701–707) is then repeated until the gap is filled. For a gap with about a 6:1 aspect ratio and about a 1000 Å width, three to five, for example four, iterations of the etch back and deposition steps are typical to obtain void free filling of the gap.

Substrates and Dielectric Materials

The above-described processes and apparatuses may deposit dielectric on any type of substrate that requires thin dielectric layers. Often, the substrate will be a semiconductor wafer having gaps in need of dielectric filling. The invention is not, however, limited to such applications. It may be employed in a myriad of other fabrication processes such as for fabricating flat panel displays.

As indicated above, this invention finds particular value in integrated circuit fabrication. The gap filling processes are performed on partially fabricated integrated circuits employing semiconductor substrates. In specific examples, the gap filling processes of this invention are employed to form shallow trench isolation (STI), pre-metal dielectric (PMD), inter-metal layer dielectric (ILD) layers, passivation layers, etc.

As indicated, the invention can effectively fill gaps having widths of 0.15 microns or less, for example 0.1 micron or less, and aspect ratios of 3:1 or greater, for example 5:1, 6:1, or even 10:1 or greater. More aggressive structures having, e.g., greater aspect ratios and smaller widths may also be used. In one example the gap width is 0.15 micrometers or less, e.g., between 0.11 micrometer and 0.08 micrometer.

The dielectrics employed to fill those gaps will often be a silicon oxide such as silicon dioxide, silicon oxynitride, silicon oxyfluoride, and doped variants of each of these. Therefore, the scope of the invention includes at least phosphorus-doped, boron/phosphorus-doped oxides and fluorine/phosphorus-doped oxides. As indicated, the dielectric may also be a phosphorus- and boron-doped silicon oxide glass (BPSG).

ALTERNATIVE EMBODIMENTS

While the invention is primarily described herein with reference to an etch-enhanced multi-step gap fill process, it should be understood that the biased $H_2$ etch may also be conducted independent of the other steps of the gap fill process. For example, the biased $H_2$ etch may be applied to etch a silicon-based dielectric in any appropriate context.

CONCLUSION

While this invention has been described in terms of a few preferred embodiments, it should not be limited to the specifics presented above. Many variations on the above-described preferred embodiments, may be employed. Therefore, the invention should be broadly interpreted with reference to the following claims.

What is claimed is:

1. A method of filling gaps on a semiconductor substrate, the method comprising:
   (a) partially filling a gap on a semiconductor substrate with a dielectric using a high density plasma chemical vapor deposition process and deposition chemistry comprising a silicon-containing dielectric precursor;
   (b) partially removing dielectric deposited in the gap from the gap opening by an etch back process conducted with etch process chemistry free of silicon-containing dielectric precursor and consisting essentially of hydrogen, wherein the substrate is biased during the etch back process and the etch rate is determined by the substrate bias power;
   (c) further filling of the partially filled gap by a high density plasma chemical vapor deposition process and deposition chemistry comprising a silicon-containing dielectric precursor.

2. The method of claim 1, wherein (b) and (c) are repeated until the gap is filled.

3. The method of claim 1, wherein (b) comprises a substantially isotropic plasma etch.

4. The method of claim 1, wherein the etch rate increases with increasing substrate bias power.

5. The method of claim 1, wherein the substrate bias power is set between 500 and 5000W.

6. The method of claim 1, wherein the bias to source plasma power ratio for substrate bias power is at least 0.5.

7. The method of claim 1, wherein the bias to source plasma power ratio for substrate bias power is about 0.75.

8. The method of claim 1, wherein the etch process chemistry further comprises an inert gas selected from the group consisting of He, Ar and $N_2$.

9. The method of claim 8, wherein the etch plasma chemistry further comprises He.

10. The method of claim 1, wherein the deposition and etch steps are conducted in a single plasma reactor process chamber.

11. The method of claim 10, wherein the plasma generated for deposition and etch is a radio frequency based inductively coupled plasma.

12. The method of claim 1, wherein the etch is conducted using plasma process chemistry and reactor conditions as follows:

| | |
|---|---|
| Wafer temp (° C.) | 250–700 |
| $H_2$ (sccm) | 300–2000 |
| He (sccm) | 50–1000 |
| Pressure (mTorr) | 0.2–100 |
| Bias (HF RF) Power (W) | 500–7000 |
| Source (LF) Power (W). | 2000–7000 |

13. The method of claim 12, wherein the etch is conducted using plasma process chemistry and reactor condition as follows:

| | |
|---|---|
| Wafer temp (° C.) | 650 |
| $H_2$ (sccm) | 800 |
| He (sccm) | 300 |
| Pressure (mTorr) | 7.0 |
| Bias (HF RF) Power (W) | 3000 |
| Source (LF) Power (W). | 4000 |

14. The method of claim 1, wherein the deposited dielectric is silicon dioxide ($SiO_2$).

15. The method of claim 14, wherein the deposition is conducted using process chemistry as follows:

| Gas | Flow Rate (sccm) |
|---|---|
| $SiH_4$ | 10–300 |
| $O_2$ | 20–1000 |
| He | 0–1000 |
| $H_2$ | 0–5000. |

16. A method of etching a dielectric on a semiconductor substrate, the method comprising:
   removing dielectric on the substrate by a biased plasma etch process conducted with process chemistry free of silicon-containing dielectric precursor and consisting essentially of hydrogen.

17. The method of claim 16, wherein the etching is part of a multi-step etch-enhanced gap fill process and the dielectric is partially removed from the gap opening.

18. The method of claim 16, wherein the etch plasma chemistry further comprises He.

19. The method of claim 18, wherein the etch is conducted using plasma process chemistry and reactor conditions as follows:

| | |
|---|---|
| Wafer temp (° C.) | 250–700 |
| H$_2$ (sccm) | 300–2000 |
| He (sccm) | 50–1000 |
| Pressure (mTorr) | 0.2–100 |
| Bias (HF RF) Power (W) | 500–7000 |
| Source (LF) Power (W). | 2000–7000 |

20. The method of claim 18, wherein the etch is conducted using plasma process chemistry and reactor condition as follows:

| | |
|---|---|
| Wafer temp (° C.) | 650 |
| H$_2$ (sccm) | 800 |
| He (sccm) | 300 |
| Pressure (mTorr) | 7.0 |
| Bias (HF RF) Power (W) | 3000 |
| Source (LF) Power (W). | 4000 |

* * * * *

UNITED STATES PATENT AND TRADEMARK OFFICE
CERTIFICATE OF CORRECTION

PATENT NO. : 7,163,896 B1  Page 1 of 1
APPLICATION NO. : 10/733858
DATED : January 16, 2007
INVENTOR(S) : Zhu et al.

It is certified that error appears in the above-identified patent and that said Letters Patent is hereby corrected as shown below:

In the Title Page:

In the (75) Inventors section, change "Pingsheng, Sun" to --Pinsheng, Sun--.

In the Specification:

Column 7, line 57, change "2000" to --200--.

Signed and Sealed this

Twentieth Day of November, 2007

JON W. DUDAS
*Director of the United States Patent and Trademark Office*